US012650564B2

(12) United States Patent
Cheng et al.

(10) Patent No.: US 12,650,564 B2
(45) Date of Patent: Jun. 9, 2026

(54) HEAT CONDUCTING MEMBER, OPTICAL MODULE, HEAT SINK, AND METHOD FOR PREPARING HEAT CONDUCTING MEMBER

(71) Applicant: HUAWEI TECHNOLOGIES CO., LTD., Shenzhen (CN)

(72) Inventors: Ming Cheng, Dongguan (CN); Buping Yuan, Dongguan (CN); Chengpeng Yang, Dongguan (CN); Yuping Hong, Dongguan (CN); Qinghe Zhang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 201 days.

(21) Appl. No.: 18/484,580

(22) Filed: Oct. 11, 2023

(65) Prior Publication Data

US 2024/0040751 A1     Feb. 1, 2024

Related U.S. Application Data

(63) Continuation of application No. PCT/CN2022/085534, filed on Apr. 7, 2022.

(30) Foreign Application Priority Data

Apr. 13, 2021     (CN) .......................... 202110396881.3

(51) Int. Cl.
  *G02B 6/42*        (2006.01)
  *H05K 7/20*        (2006.01)
  *H10W 40/25*       (2026.01)
(52) U.S. Cl.
  CPC ......... *G02B 6/4269* (2013.01); *G02B 6/4272* (2013.01); *H05K 7/20427* (2013.01); *H10W 40/254* (2026.01)

(58) Field of Classification Search
  CPC . G02B 6/4269; G02B 6/4272; H01L 23/3732; H05K 7/20427; H10W 40/254
  See application file for complete search history.

(56) References Cited

U.S. PATENT DOCUMENTS 5,453,293 A * 9/1995 Beane ..................... C23C 26/00
                                                    427/217
5,614,320 A * 3/1997 Beane ..................... B05D 7/24
                                                    428/404

(Continued)

FOREIGN PATENT DOCUMENTS

CN       101853822 A    10/2010
CN       102286719 A *  12/2011

(Continued)

OTHER PUBLICATIONS

Gloxman et al., "Adhesion improvement of diamond films on steel substrates using chromium nitride interlayers", Diamond and Related Materials, vol. 6, Issues 5-7, Apr. 1997, pp. 796-801, doi: 10.1016/S0925-9635(96)00671-1) (Year: 1997).*

(Continued)

*Primary Examiner* — Robert J Hoffberg

(57) ABSTRACT

A heat conducting member includes a substrate and a heat conducting layer. The substrate includes a heat conducting surface. The heat conducting layer includes a transition layer and a protective layer. The transition layer is disposed on the heat conducting surface, and the protective layer is disposed on a surface that is of the transition layer and that is away from the heat conducting surface. Roughness Ra of the protective layer is less than or equal to 0.4. The transition layer can provide a hardness transition function between the substrate and the protective layer, to facilitate improving overall hardness of the heat conducting member. The pro- (Continued)

tective layer may ensure surface hardness, to prevent an undesirable situation such as a scratch.

10 Claims, 8 Drawing Sheets

(56) References Cited

U.S. PATENT DOCUMENTS

| | | | | |
|---|---|---|---|---|
| 5,853,888 A | * | 12/1998 | Dutta | C23C 14/5853 |
| | | | | 427/372.2 |
| 10,494,713 B2 | * | 12/2019 | Xu | C23C 16/56 |
| 2006/0113546 A1 | | 6/2006 | Sung | |
| 2006/0270275 A1 | * | 11/2006 | Morohashi | G02B 6/4292 |
| | | | | 439/607.01 |
| 2007/0148462 A1 | * | 6/2007 | Hsiao | C23C 16/0272 |
| | | | | 428/408 |
| 2012/0288698 A1 | | 11/2012 | Moldovan et al. | |
| 2017/0260625 A1 | | 9/2017 | Xu et al. | |
| 2025/0189699 A1 | * | 6/2025 | Wei | C23C 18/1806 |

FOREIGN PATENT DOCUMENTS

| | | | | | |
|---|---|---|---|---|---|
| CN | 102965666 A | * | 3/2013 | | |
| CN | 106273093 A | | 1/2017 | | |
| CN | 207398158 U | | 5/2018 | | |
| CN | 108291299 A | | 7/2018 | | |
| CN | 109548372 A | | 3/2019 | | |
| CN | 110527964 A | | 12/2019 | | |
| DE | 19842396 A1 | * | 4/2000 | ............... | C25B 1/13 |
| JP | 2015139614 A | * | 8/2015 | | |

OTHER PUBLICATIONS

Applied Diamond, "Metallization", https://usapplieddiamond.com/metallization/, Mar. 31, 2017, 6 pages). (Year: 2017).*

Riyadi, T., "Mechanical Properties of Cr—Cu Coatings Produced by Electroplating", AIP Conference Proceedings 1855, 030007 Jun. 2017, 6 pages, doi: 10.1063/1.4985477. (Year: 2017).*

Extended European Search Report dated Aug. 14, 2024, issued for European Application No. 22787429.4 (7 pages).

International Search Report dated Jun. 2, 2022, issued for International Application No. PCT/CN2022/085534 (10 pages).

* cited by examiner

S20 — Provide a substrate

S21 — Prepare a transition layer on a heat conducting surface

S22 — Prepare a first auxiliary bonding layer on a surface of the transition layer S23 — Prepare a protective layer on a surface of the first auxiliary bonding layer S30 — Provide a substrate S31 — Prepare an abrasive layer on a heat conducting surface S32 — Polish a surface of the abrasive layer S33 — Prepare a transition layer on the surface of the abrasive layer S34 — Prepare a first auxiliary bonding layer on the surface of the abrasive layer S35 — Prepare a protective layer on a surface of the first auxiliary bonding layer

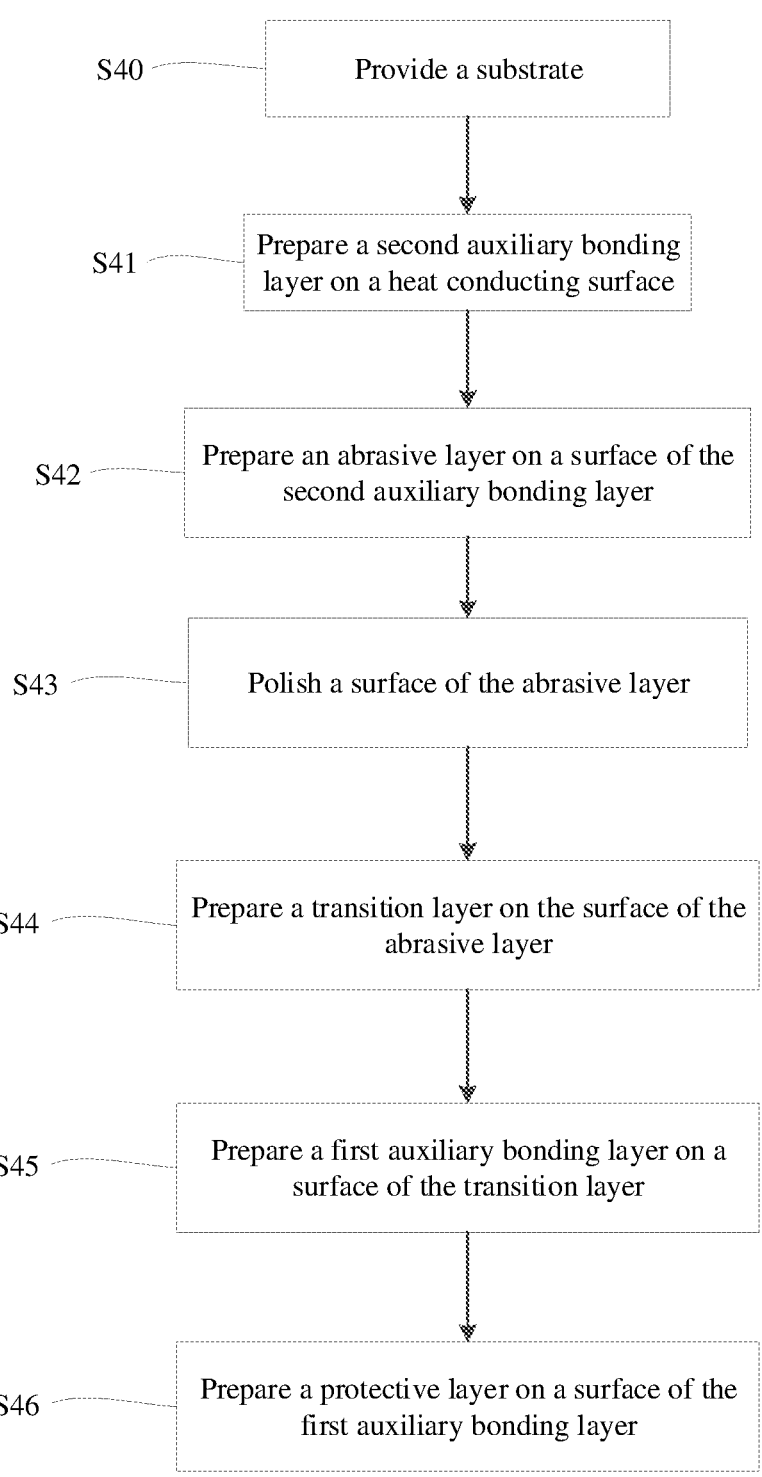

S40 — Provide a substrate

S41 — Prepare a second auxiliary bonding layer on a heat conducting surface

S42 — Prepare an abrasive layer on a surface of the second auxiliary bonding layer S43 — Polish a surface of the abrasive layer S44 — Prepare a transition layer on the surface of the abrasive layer S45 — Prepare a first auxiliary bonding layer on a surface of the transition layer S46 — Prepare a protective layer on a surface of the first auxiliary bonding layer

HEAT CONDUCTING MEMBER, OPTICAL MODULE, HEAT SINK, AND METHOD FOR PREPARING HEAT CONDUCTING MEMBER

CROSS-REFERENCE TO RELATED APPLICATIONS

This application is a continuation of International Application No. PCT/CN2022/085534, filed on Apr. 7, 2022, which claims priority to Chinese Patent Application No. 202110396881.3, filed on Apr. 13, 2021. The disclosures of the aforementioned applications are hereby incorporated by reference in their entireties.

TECHNICAL FIELD

This disclosure relates to the field of electronic device technologies, and in particular, to a heat conducting member, an optical module, a heat sink, and a method for preparing the heat conducting member.

BACKGROUND

An optical module is one of core parts in an optical network device, and a main function of the optical module is to perform mutual conversion between an optical signal and an electrical signal. With continuous improvement of performance of the optical module, power consumption of the optical module is also increasing. As a result, the optical module generates more heat in a working process. In actual application, to ensure normal working of the optical module, heat dissipation processing needs to be performed on the optical module.

Currently, to improve heat dissipation performance of the optical module, a heat sink is usually provided. After a heat conducting surface of the optical module is attached to a heat conducting surface of the heat sink, heat in the optical module can be transferred to the heat sink, so that heat dissipation of the optical module is implemented. Heat transfer is mainly performed between the optical module and the heat sink through contact. Therefore, roughness of the heat conducting surface between the optical module and the heat sink determines heat transfer efficiency. When the roughness of the heat conducting surface is excessively large, a large thermal contact resistance is generated. Therefore, heat transfer efficiency between the optical module and the heat sink is reduced. However, if the thermal contact resistance is reduced by simply reducing the roughness of the heat conducting surface, an undesirable problem such as excessively high processing costs may be caused. In addition, the optical module is usually installed in a pluggable manner. Therefore, mutual friction exists between the heat conducting surface of the optical module and the heat conducting surface of the heat sink. In a case of frequent plugging, a scratch is generated on the heat conducting surface, and therefore the thermal contact resistance is increased.

Therefore, how to reduce the thermal contact resistance between the optical module and the heat sink and improve a scratch resistance capability of the heat conducting surface becomes urgent technical problems to be solved.

SUMMARY

This disclosure provides a heat conducting member, an optical module, a heat sink, and a method for preparing the heat conducting member, to effectively reduce thermal contact resistance of a heat conducting surface, improve a scratch resistance capability and corrosion resistance of the heat conducting surface, and reduce a friction coefficient of the heat conducting surface.

According to one aspect, this disclosure provides a heat conducting member, and the heat conducting member includes a substrate and a heat conducting layer. The substrate includes a heat conducting surface. The heat conducting layer includes a transition layer and a protective layer. The transition layer is disposed on the heat conducting surface, and the protective layer is disposed on a surface that is of the transition layer and that is away from the heat conducting surface. Roughness Ra of the protective layer is less than or equal to 0.4 µm. Specifically, a main function of the transition layer is to serve as hardness transition between the substrate and the protective layer, which can effectively improve comprehensive hardness of the heat conducting member. A main function of the protective layer is to improve surface hardness of the heat conducting member and provide high corrosion resistance and a low friction coefficient. In an actual application process of the heat conducting member, due to high hardness of the protective layer, the heat conducting member has a good scratch resistance capability, so that excellent surface roughness can be maintained. In addition, the protective layer can further provide high corrosion resistance and a low friction coefficient. In summary, in the heat conducting member provided in this embodiment of this disclosure, the transition layer can provide a hardness transition function between the substrate and the protective layer, to facilitate improving overall hardness of the heat conducting member. The protective layer may ensure surface hardness, to prevent an undesirable situation such as a scratch. In addition, due to good corrosion resistance of the protective layer, in some harsh environments, the protective layer can maintain roughness of the protective layer, which helps ensure heat conduction performance of the heat conducting member. In addition, the protective layer further has the low friction coefficient. When a surface of the protective layer rubs with a surface of another part, friction resistance can be effectively reduced, so that good use effect is achieved.

In specific application, microhardness (HV) of the protective layer may be greater than 1000. A material of the protective layer may be diamond, diamond-like carbon, amorphous alloy, or the like. The material of the protective layer is not limited in this disclosure.

In addition, microhardness of the transition layer may be between microhardness of the substrate and microhardness of the protective layer. A material of the transition layer may be any one of nickel, chromium, and chromium nitride. In actual application, the material of the transition layer is not limited in this disclosure.

In some implementations, a first auxiliary bonding layer may be further disposed between the transition layer and the protective layer. A material of the first auxiliary bonding layer may be tungsten carbide, chromium carbide, or the like. The first auxiliary bonding layer may improve bonding strength between the transition layer and the protective layer, to prevent an undesirable situation such as falling off.

In addition, in some implementations, the heat conducting layer may further include an abrasive layer. The abrasive layer may be located between the heat conducting surface and the transition layer. In specific application, processing such as polishing may be performed on the abrasive layer, so that roughness Ra of a surface of the abrasive layer is not greater than 0.4 µm, and polishing effect can be ensured. It may be understood that, in a specific implementation, when the protective layer includes the foregoing abrasive layer, the heat conducting surface of the substrate may not be polished, or may be polished.

In addition, in some implementations, the heat conducting layer may further include a second auxiliary bonding layer. The second auxiliary bonding layer may be located between the heat conducting surface and the abrasive layer. A material of the second auxiliary bonding layer may be nickel, chromium, or the like. The second auxiliary bonding layer may effectively improve bonding strength between the heat conducting surface and the abrasive layer, to prevent an undesirable phenomenon such as falling off.

According to another aspect, this disclosure further provides an optical module, and the optical module includes a housing, a circuit board assembly, and any one of the foregoing heat conducting members. The circuit board assembly is disposed in the housing, and the housing includes a substrate. The foregoing heat conducting layer may be disposed on a surface of the housing. Specifically, the housing may also be understood as the foregoing substrate, or the substrate is a part of the housing. To be specific, the surface of the housing includes the heat conducting surface. The heat conducting layer may form a surface with high heat conduction efficiency and high hardness on the surface of the housing. When the housing is in dry contact with another part through the heat conducting layer, thermal resistance may be effectively reduced.

In addition, this disclosure further provides a heat sink, and the heat sink includes a housing and any one of the foregoing heat conducting members. The housing may include a substrate. The foregoing heat conducting layer may be disposed on a surface of the housing. Specifically, the housing may also be understood as the foregoing substrate, or the substrate is a part of the housing. To be specific, the surface of the housing includes the heat conducting surface. The heat conducting layer may form a surface with high heat conduction efficiency and high hardness on the surface of the housing. When the housing is in dry contact with another part through the heat conducting layer, thermal resistance may be effectively reduced.

According to another aspect, this disclosure further provides a method for preparing a heat conducting member, and the method includes: providing a substrate, where the substrate includes a heat conducting surface; preparing a transition layer on the heat conducting surface; and preparing a protective layer on a surface of the transition layer.

In specific preparation, before preparing the transition layer on the heat conducting surface, the method may further include: polishing the heat conducting surface. The heat conducting surface has low roughness, so that roughness of the protective layer is ensured.

In addition, before preparing the protective layer on the surface of the transition layer, the method may further include: preparing a first auxiliary bonding layer on the surface of the transition layer. The first auxiliary bonding layer may improve bonding strength between the transition layer and the protective layer.

When the first auxiliary bonding layer is prepared, a material of the first auxiliary bonding layer may be tungsten carbide, chromium carbide, or the like. The tungsten carbide, the chromium carbide, or the like may be formed on the surface of the transition layer by using a process such as physical vapor deposition.

When the heat conducting member is prepared, the following method may also be used:

The method may include: providing a substrate, where the substrate has a heat conducting surface; preparing an abrasive layer on the heat conducting surface; preparing a transition layer on a surface of the abrasive layer; and preparing a protective layer on a surface of the transition layer.

Before preparing the transition layer on the surface of the abrasive layer, the method may further include: polishing the surface of the abrasive layer. The surface of the abrasive layer has low roughness, so that roughness of the protective layer is ensured.

In addition, in specific preparation, before preparing the abrasive layer on the heat conducting surface, the method may further include: preparing a second auxiliary bonding layer on the heat conducting surface.

When the second auxiliary bonding layer is prepared, a material of the second auxiliary bonding layer may be nickel or the like. The material such as the nickel may be formed on the heat conducting surface by using a process such as chemical plating.

In addition, before preparing the protective layer on the surface of the transition layer, the method may further include: preparing a first auxiliary bonding layer on the surface of the transition layer. When the first auxiliary bonding layer is prepared, a material of the first auxiliary bonding layer may be tungsten carbide, chromium carbide, or the like. The tungsten carbide, the chromium carbide, or the like may be formed on the surface of the transition layer by using a process such as physical vapor deposition.

It may be understood that the heat conducting member may be prepared without following the foregoing disclosed method or step sequence. A specific preparation process and procedure of the heat conducting member are not limited in this disclosure.

BRIEF DESCRIPTION OF DRAWINGS

FIG. 10 is a flowchart of a method for preparing another heat conducting member according to an embodiment of this disclosure;

DESCRIPTION OF EMBODIMENTS

To make the objectives, technical solutions, and advantages of this disclosure clearer, the following further describes this disclosure in detail with reference to the accompanying drawings.

Figure 1:
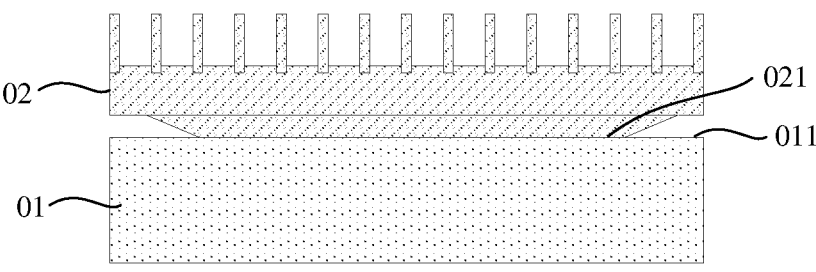
FIG. 1 is a schematic diagram of a structure of dry contact between an optical module and a heat sink according to an embodiment of this disclosure.

A heat conducting member provided in embodiments of this disclosure may be applied to the field of chip packaging, an optical module, a heat sink, or the like. For example, as shown in FIG. 1, an optical module 01 and a heat sink 02 are used as an example. In actual application, the optical module 01 generates heat when working. To dissipate heat for the optical module 01, the heat sink 02 may be attached to a housing of the optical module 01. Specifically, the housing of the optical module 01 includes a heat conducting surface 011, and the heat sink 02 includes a heat conducting surface 021 that is configured to be attached to the heat conducting surface 011. After the heat conducting surface 011 is in dry contact with the heat conducting surface 021, heat in the optical module 01 may be transferred to the heat sink 02 for heat dissipation. The dry contact means that the heat conducting surface 011 and the heat conducting surface 021 are in a close attaching relationship, and no material is filled between the two attaching surfaces.

In specific application, thermal contact resistance inevitably exists between the heat conducting surface 011 and the heat conducting surface 021. When the thermal contact resistance is excessively large, heat transfer efficiency between the heat conducting surface 011 and the heat conducting surface 021 is affected.

Figure 2:
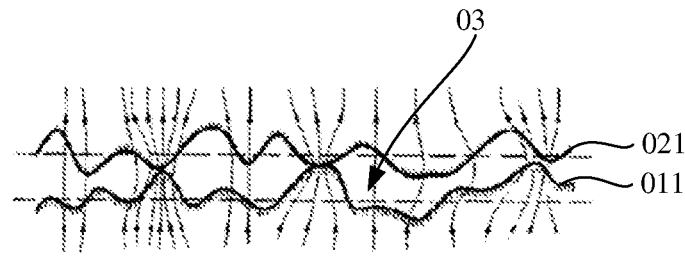
FIG. 2 is a schematic diagram of a micro structure of dry contact between an optical module and a heat sink according to an embodiment of this disclosure.

Specifically, as shown in FIG. 2, from a micro perspective, even if the heat conducting surface 011 is closely attached to the heat conducting surface 021, a gap 03 still exists between the two heat conducting surfaces. When heat is conducted between the two heat conducting surfaces, the gap 03 may increase conduction resistance, so that thermal resistance is formed. A main factor that affects thermal resistance between two heat conducting surfaces is roughness of the two heat conducting surfaces. Roughness is unevenness of a processed surface (for example, the heat conducting surface 011 or the heat conducting surface 021) having a small spacing and a small peak and valley. Smaller roughness indicates a smoother surface. After the heat conducting surface 011 is in contact with the heat conducting surface 021, smaller roughness of the two heat conducting surfaces indicates a smaller gap 03, so that the thermal contact resistance between the two heat conducting surfaces is smaller, which is conducive to heat dissipation of the optical module.

An objective of embodiments of this disclosure is to provide a heat conducting member that has low roughness and is easy to manufacture, to facilitate heat dissipation of a component or an apparatus that uses the heat conducting member.

Terms used in the following embodiments are merely intended to describe specific embodiments, but not to limit this disclosure. Terms "one", "a", and "the" of singular forms used in this specification and the appended claims of this disclosure are also intended to include a form like "one or more", unless otherwise specified in the context clearly. It should be further understood that, in the following embodiments of this disclosure, "at least one" means one, two, or more.

Reference to "one embodiment" described in this specification or the like means that one or more embodiments of this disclosure include a particular feature, structure, or characteristic described with reference to embodiments. Therefore, statements such as "in an embodiment", "in some embodiments", and "in other embodiments" that appear at different places in this specification do not necessarily mean reference to a same embodiment, instead, the statements mean "one or more but not all of embodiments", unless otherwise specifically emphasized in another manner. Terms "include", "have", and their variants all mean "include but are not limited to", unless otherwise specifically emphasized in another manner.

Figure 3:
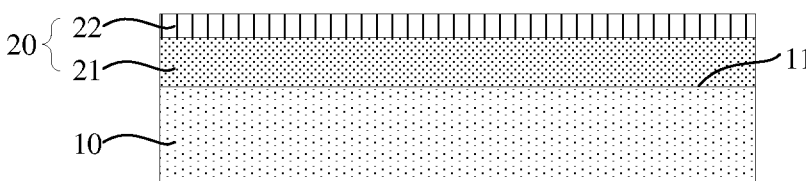
FIG. 3 is a schematic diagram of a structure of a heat conducting member according to an embodiment of this disclosure.

As shown in FIG. 3, in an embodiment provided in this disclosure, a heat conducting member includes a substrate 10 and a heat conducting layer 20. An upper surface of the substrate 10 has a heat conducting surface 11. The heat conducting layer 20 includes a transition layer 21 and a protective layer 22. The transition layer 21 is disposed on the heat conducting surface 11, and the protective layer 22 is disposed on an upper surface of the transition layer 21. Specifically, a main function of the transition layer 21 is to serve as hardness transition between the substrate 10 and the protective layer 22, which can effectively improve comprehensive hardness of the heat conducting member. Microhardness of the transition layer 21 may be between the substrate 10 and the protective layer 22. A main function of the protective layer 22 is to improve surface hardness of the heat conducting member and provide high corrosion resistance and a low friction coefficient. In an actual application process of the heat conducting member, due to high hardness of the protective layer 22, the heat conducting member may have a good scratch resistance capability, so that excellent surface roughness can be maintained. In addition, the protective layer 22 can further provide high corrosion resistance and a low friction coefficient. In summary, in the heat conducting member provided in this embodiment of this disclosure, the transition layer 21 can provide a hardness transition function between the substrate 10 and the protective layer 22, to facilitate improving overall hardness of the heat conducting member. The protective layer 22 may ensure surface hardness, to prevent an undesirable situation such as a scratch. In addition, due to good corrosion resistance of the protective layer 22, in some harsh environments, the protective layer 22 can maintain roughness of the protective layer 22, which helps ensure heat conduction performance of the heat conducting member. In addition, the protective layer 22 further has the low friction coefficient. When a surface of the protective layer 22 rubs with a surface of another part, friction resistance can be effectively reduced, so that good use effect is achieved.

In actual application, the surface of the protective layer 22 may be in dry contact with another part (for example, the heat sink mentioned above). Heat in the heat conducting member may be transferred to the part by using the transition layer 21 and the protective layer 22, so that heat dissipation of the heat conducting member is implemented.

In a specific implementation, a material of the substrate 10 may be a metal material such as aluminum or aluminum alloy, or may be another non-metal material. In terms of material selection, the substrate 10 may be prepared by selecting a material with good heat conduction performance, so that the substrate 10 has high heat conduction performance.

During preparation, the substrate 10 may be manufactured by using a process such as die casting forming or machine tool processing. In addition, after the substrate 10 is prepared and formed, grinding processing, polishing processing, and the like may be performed on the heat conducting surface 11 to reduce roughness of the heat conducting surface 11, so that the roughness Ra of the heat conducting surface 11 is not greater than 0.4 mm. As a result, surface roughness of the protective layer 22 may be ensured. Specifically, when the transition layer 21 is prepared on the heat conducting surface 11, due to low roughness of the heat conducting surface 11, after the transition layer 21 is prepared and formed, surface roughness of the transition layer 21 is approximately the same as the roughness of the heat conducting surface 11. Correspondingly, when the protective layer 22 is prepared on a surface of the transition layer 21, due to low roughness of the surface of the transition layer 21, after the protective layer 22 is prepared and formed, surface roughness of the protective layer 22 is approximately the same as the roughness of the surface of the transition layer 21. In some implementations, sandblasting processing may also be performed on the heat conducting surface 11, to improve bonding strength between the heat conducting surface 11 and the transition layer 21, and prevent the transition layer 21 from falling off or having another undesirable phenomenon. It may be understood that, in some other implementations, a sandblasting process may also be omitted. A material and a preparation process of the substrate 10 are not limited in this disclosure.

In addition, a material of the transition layer 21 may be nickel, chromium, chromium nitride, or the like. For example, during preparation, the nickel material may be formed on the heat conducting surface 11 in a chemical plating manner. Alternatively, the chromium material may be formed on the heat conducting surface 11 by using a process such as physical vapor deposition (PVD). A thickness of the transition layer 21 may be about 4 μm. The thickness of the transition layer 21 is not limited in this disclosure. It may be understood that, in a specific implementation, a material and a preparation process of the transition layer 21 are not limited in this disclosure.

In addition, microhardness (HV) of the protective layer 22 may be greater than 1000. A material of the protective layer 22 may be diamond, diamond-like carbon, amorphous alloy, or the like. The protective layer 22 may be formed on the surface of the transition layer 21 by using a process such as physical vapor deposition or CVD (Chemical Vapor Deposition). A thickness of the protective layer 22 may be about 2 μm thicknesses. The thickness of the protective layer 22 is not limited in this disclosure. It may be understood that, in a specific implementation, a material and a preparation process of the protective layer 22 are not limited in this disclosure either.

Figure 4:
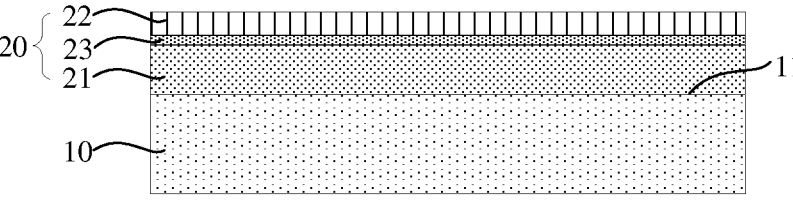
FIG. 4 is a schematic diagram of a structure of another heat conducting member according to an embodiment of this disclosure.
Figure 5:
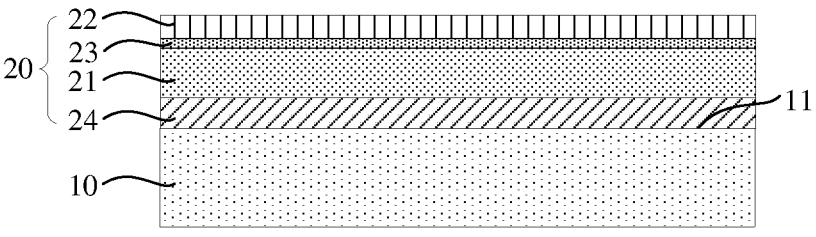
FIG. 5 is a schematic diagram of a structure of another heat conducting member according to an embodiment of this disclosure.

In addition, as shown in FIG. 4, in a specific implementation, to improve bonding strength between the transition layer 21 and the protective layer 22, a first auxiliary bonding layer 23 may be further disposed between the transition layer 21 and the protective layer 22. A material of the first auxiliary bonding layer 23 may be tungsten carbide, chromium carbide, or the like. A thickness of the first auxiliary bonding layer 23 may be about 0.5 μm. A material, a thickness, and a preparation process of the first auxiliary bonding layer 23 are not limited in this disclosure In addition, in actual application, the heat conducting layer 20 may further include more layer structures. For example, as shown in FIG. 5, in an embodiment provided in this disclosure, the heat conducting layer 20 may further include an abrasive layer 24. Specifically, the abrasive layer 24 is located between the heat conducting surface 11 and the transition layer 21. In this embodiment provided in this disclosure, the abrasive layer 24 may be of copper. Due to good heat conduction performance of the copper material, overall heat conduction performance of the heat conducting member can be ensured. During preparation, the copper may be formed on a surface of the transition layer 21 by using a process such as electroplating, and the surface of the transition layer 21 has a specific thickness (for example, 15 μm surfaces). Then, polishing processing may be performed on the abrasive layer 24. For example, after a thickness of 10 μm is removed by polishing, roughness Ra of a surface of the abrasive layer 24 may be not greater than 0.4 μm, so that polishing effect can be ensured. It may be understood that, in a specific implementation, when the protective layer 22 includes the foregoing abrasive layer 24, the heat conducting surface 11 of the substrate 10 may not be polished, or may be polished.

It may be understood that, in another implementation, the abrasive layer 24 may also be made of copper alloy and the like. A material, a forming manner, and a thickness of the abrasive layer 24 are not limited in this disclosure.

Figure 6:
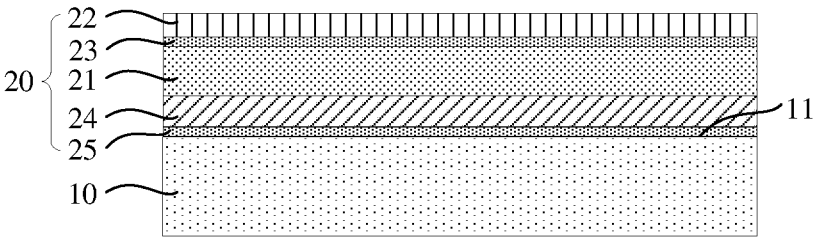
FIG. 6 is a schematic diagram of a structure of another heat conducting member according to an embodiment of this disclosure.

In addition, in actual application, to improve bonding strength between the abrasive layer 24 and the heat conducting surface 11, the heat conducting layer 20 may further include a second auxiliary bonding layer 25. Specifically, as shown in FIG. 6, the second auxiliary bonding layer 25 is located between the heat conducting surface 11 and the abrasive layer 24. A material of the second auxiliary bonding layer 25 may be nickel, chromium, or the like. For example, during preparation, the nickel material may be formed on the heat conducting surface 11 in a chemical plating manner. Alternatively, the chromium material may be formed on the heat conducting surface 11 by using a process such as physical vapor deposition (PVD). The second auxiliary bonding layer 25 may effectively improve bonding strength between the heat conducting surface 11 and the abrasive layer 24, to prevent an undesirable phenomenon such as falling off. A thickness of the second auxiliary bonding layer 25 may be about 0.5 μm. A material, a preparation process, and a thickness of the second auxiliary bonding layer 25 are not limited in this disclosure.

Figure 7:
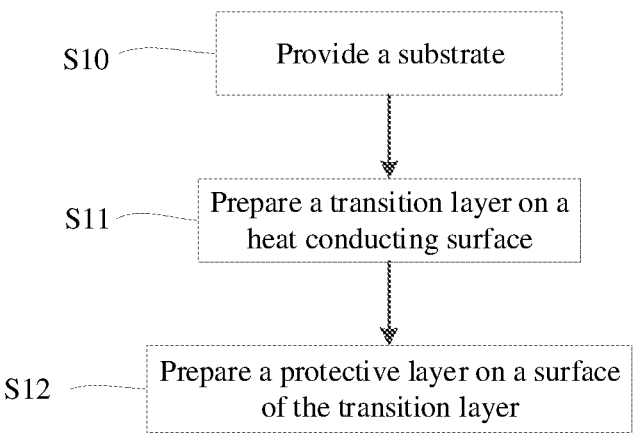
FIG. 7 is a flowchart of a method for preparing a heat conducting member according to an embodiment of this disclosure.

For the heat conducting member described above, as shown in FIG. 7, this disclosure further provides a method for preparing a heat conducting member. With reference to FIG. 3, the method may include the following steps:

S10: Provide a substrate. The substrate includes a heat conducting surface. With reference to FIG. 3 and FIG. 7, when the substrate 10 is prepared, the substrate 10 may be manufactured by using a material such as aluminum or aluminum alloy and by using a process such as die casting forming or machine tool processing. After the substrate 10 is prepared and formed, grinding processing, polishing processing, and the like may be performed on the heat conducting surface 11 to reduce roughness of the heat conducting surface 11, so that the heat conducting surface 11 has good roughness (for example, roughness Ra of the heat conducting surface 11 may be less than 0.4 mm). In some implementations, sandblasting processing may also be performed on the heat conducting surface 11, to improve bonding strength between the heat conducting surface 11 and the transition layer 21, and prevent the transition layer 21 from falling off or having another undesirable phenomenon. It may be understood that, in some other implementations, a sandblasting process may also be omitted. A material and a preparation process of the substrate 10 are not limited in this disclosure.

S11: Prepare the transition layer on the heat conducting surface. When the transition layer 21 is prepared, a material of the transition layer 21 may be nickel, chromium, chromium nitride, or the like. For example, during preparation, the nickel material may be formed on the heat conducting surface 11 in a chemical plating manner. Alternatively, the chromium material may be formed on the heat conducting surface 11 by using a process such as physical vapor deposition (PVD). A thickness of the transition layer 21 may be about 4 μm. The thickness of the transition layer 21 is not limited in this disclosure.

S12: Prepare a protective layer on a surface of the transition layer. When the protective layer 22 is prepared, a material of the protective layer 22 may be diamond, diamond-like carbon, amorphous alloy, or the like. The protective layer 22 may be formed on the surface of the transition layer 21 by using a process such as physical vapor deposition or CVD (Chemical Vapor Deposition). A thickness of the protective layer 22 may be about 2 μm. The thickness of the protective layer 22 is not limited in this disclosure.

Figure 8:
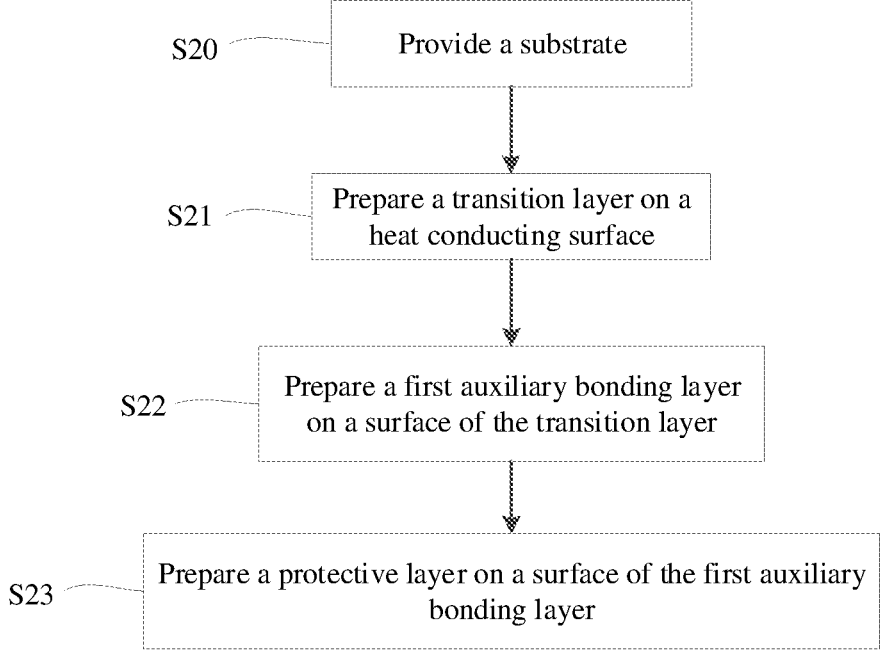
FIG. 8 is a flowchart of a method for preparing another heat conducting member according to an embodiment of this disclosure.

In addition, as shown in FIG. 8, to improve bonding strength between a transition layer 21 and a protective layer 22 and prevent an undesirable situation such as falling off, refer to FIG. 4, the following method may be further used when a heat conducting member is prepared:

S20: Provide a substrate. The substrate includes a heat conducting surface.

S21: Prepare a transition layer on the heat conducting surface.

S22: Prepare a first auxiliary bonding layer on a surface of the transition layer. When the first auxiliary bonding layer 23 is prepared, a material of the first auxiliary bonding layer 23 may be tungsten carbide, chromium carbide, or the like. The tungsten carbide, the chromium carbide, or the like may be formed on the surface of the transition layer 21 by using a process such as electroplating. A thickness of the first auxiliary bonding layer 23 may be about 0.5 μm. The thickness of the first auxiliary bonding layer 23 is not limited in this disclosure.

S23: Prepare a protective layer on a surface of the first auxiliary bonding layer. When the protective layer 22 is prepared, a material of the protective layer 22 may be diamond, diamond-like carbon, amorphous alloy, or the like. The protective layer 22 may be formed on the surface of the first auxiliary bonding layer 23 by using a process such as physical vapor deposition or CVD (Chemical Vapor Deposition). A thickness of the protective layer 22 may be about 2 μm. The thickness of the protective layer 22 is not limited in this disclosure.

Figure 9:
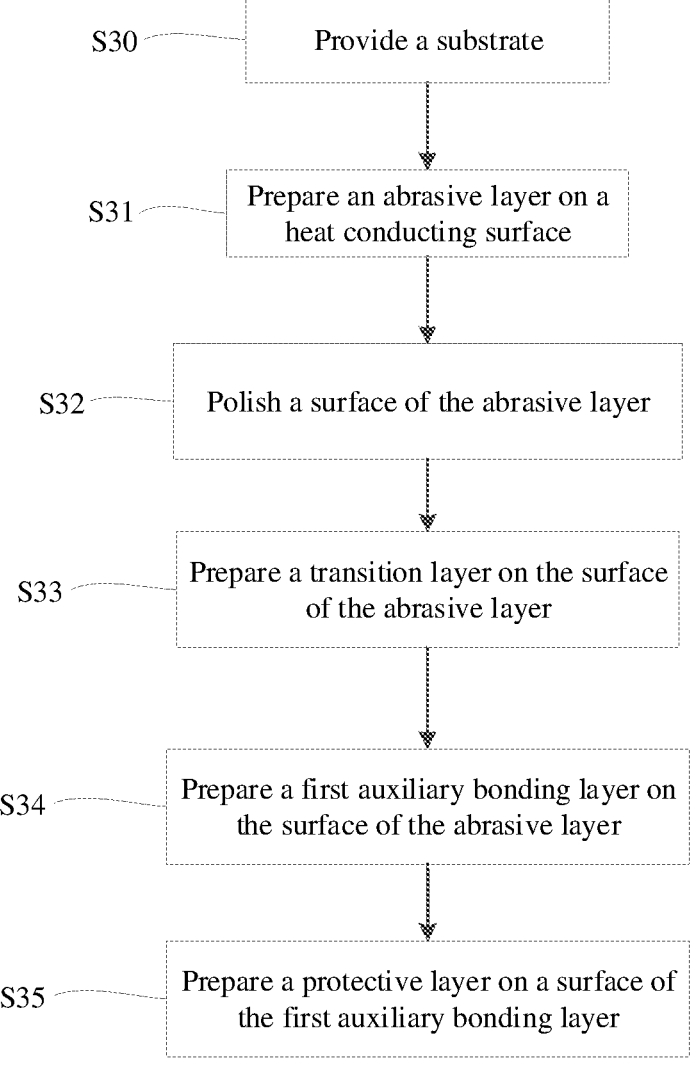
FIG. 9 is a flowchart of a method for preparing another heat conducting member according to an embodiment of this disclosure.

In addition, in actual preparation, the heat conducting layer 20 may further include more layer structures. Specifically, as shown in FIG. 9, when the heat conducting member is prepared, the following method may also be used:

S30: Provide a substrate. The substrate includes a heat conducting surface.

S31: Prepare an abrasive layer on the heat conducting surface. Refer to FIG. 5, when the abrasive layer 24 is prepared, the abrasive layer 24 may be made of a copper material. Due to good heat conduction performance of the copper material, overall heat conduction performance of the heat conducting member can be ensured. During preparation, the copper may be formed on a surface of the transition layer 21 by using a process such as electroplating, and the surface of the transition layer 21 has a specific thickness (for example, 15 μm). Then, polishing processing may be performed on the abrasive layer 24. For example, after a thickness of 10 μm is removed by polishing, roughness Ra of a surface of the abrasive layer 24 may be not greater than 0.4 μm, so that polishing effect can be ensured. It may be understood that, in a specific implementation, when the protective layer 20 includes the foregoing abrasive layer 24, the heat conducting surface 11 of the substrate 10 may not be polished, or may be polished.

S32: Polish the surface of the abrasive layer.

S33: Prepare the transition layer on the surface of the abrasive layer. When the transition layer 21 is prepared, a material of the transition layer 21 may be nickel, chromium, chromium nitride, or the like. For example, during preparation, the nickel material may be formed on the surface of the abrasive layer 24 in a chemical plating manner. Alternatively, the chromium material may be formed on the surface of the abrasive layer 24 by using a process such as physical vapor deposition (PVD). A thickness of the transition layer 21 may be about 4 μm. The thickness of the transition layer 21 is not limited in this disclosure. When the protective layer 22 is prepared, a material of the protective layer 22 may be diamond, diamond-like carbon, amorphous alloy, or the like. The protective layer 22 may be formed on the surface of the first auxiliary bonding layer 23 by using a process such as physical vapor deposition or CVD (Chemical Vapor Deposition). A thickness of the protective layer 22 may be about 2 μm. The thickness of the protective layer 22 is not limited in this disclosure.

S34: Prepare the first auxiliary bonding layer on a surface of the transition layer.

S35: Prepare the protective layer on the surface of the first auxiliary bonding layer.

In addition, in actual preparation, to improve bonding strength between the abrasive layer 24 and the heat conducting surface 11, a second auxiliary bonding layer 25 may be further prepared before the abrasive layer 24 is prepared. Specifically, as shown in FIG. 10, when the heat conducting member is prepared, the following method may also be used:

S40: Provide a substrate. The substrate includes a heat conducting surface.

S41: Prepare a second auxiliary bonding layer on the heat conducting surface. Refer to FIG. 6, when the second auxiliary bonding layer 25 is prepared, a material of the second auxiliary bonding layer 25 may be nickel or the like. The nickel material or the like may be formed on the heat conducting surface 11 by using a process such as chemical plating. A thickness of the second auxiliary bonding layer 25 may be about 0.5 μm. The thickness of the second auxiliary bonding layer 25 is not limited in this disclosure.

S42: Prepare an abrasive layer on the second auxiliary bonding layer.

S43: Polish a surface of the abrasive layer.

S44: Prepare a transition layer on the surface of the abrasive layer.

S45: Prepare a first auxiliary bonding layer on a surface of the transition layer.

S46: Prepare a protective layer on a surface of the first auxiliary bonding layer.

It may be understood that the heat conducting member may be prepared without following the foregoing disclosed method or step sequence. A specific preparation process and procedure of the heat conducting member are not limited in this disclosure.

In addition, in actual application, the foregoing heat conducting member may be applied to multiple scenarios in which dry contact between two parts needs to be implemented.

Figure 11:
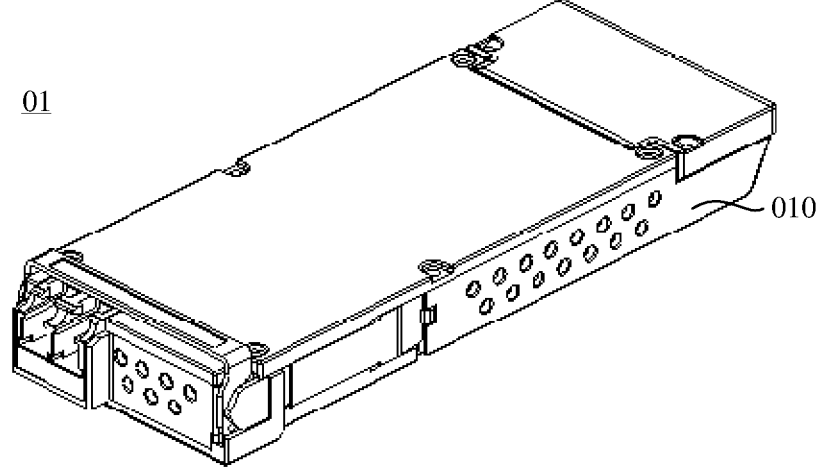
FIG. 11 is a schematic diagram of a structure of an optical module according to an embodiment of this disclosure.

For example, as shown in FIG. 11, an embodiment of this disclosure further provides an optical module 01, including a housing 010 and a circuit board assembly (not shown in the figure) disposed in the housing 010. The optical module 01 is an optoelectronic component that performs photoelectric conversion and electro-optical conversion. The circuit board assembly may include an optoelectronic component, a functional circuit, an optical interface, and the like. A transmitting end of the optical module may convert an electrical signal into an optical signal, and a receiving end may convert the optical signal into the electrical signal.

In specific application, the foregoing heat conducting layer 20 may be disposed on an upper surface of the housing 010. Specifically, the housing 010 may also be understood as the foregoing substrate 10, or the substrate 10 is a part of the housing 010. To be specific, the upper surface of the housing 010 includes the heat conducting surface 11. The heat conducting layer 20 may form a surface with high heat conduction efficiency and high hardness on the upper surface of the housing 010. When the housing 010 is in dry contact with another part through the heat conducting layer 20, thermal resistance may be effectively reduced.

Figure 12:
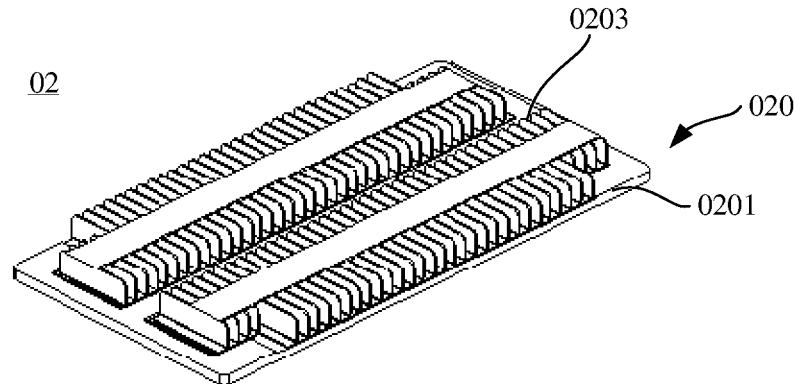
FIG. 12 is a schematic diagram of a structure of a heat sink according to an embodiment of this disclosure.
Figure 13:
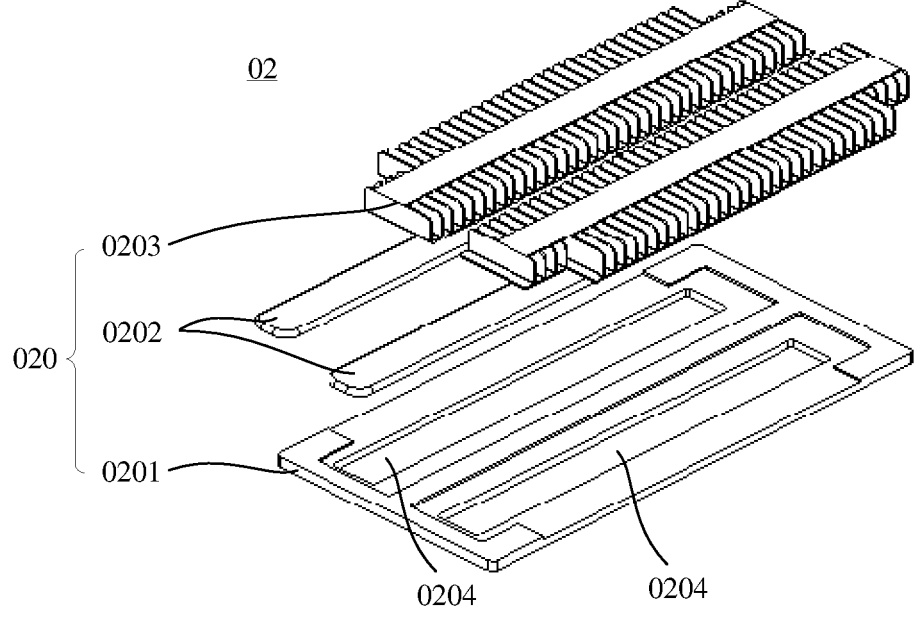
FIG. 13 is a schematic diagram of an exploded structure of a heat sink according to an embodiment of this disclosure.

In addition, as shown in FIG. 12 and FIG. 13, an embodiment of this disclosure further provides a heat sink 02, including a housing 020 and the foregoing heat conducting member. As shown in FIG. 13, specifically, the housing 020 includes a base plate 0201, heat conducting pipes 0202, and heat sink fins 0203. The base plate 0201 is of a rectangular plate structure, and a heat conducting surface is provided on a lower plate surface of the base plate 0201. Grooves 0204 are provided on an upper surface of the base plate 0201. During preparation, the base plate 0201 may be manufactured by using a material such as aluminum or aluminum alloy and by using a process such as die casting forming or machine tool processing. Two heat conducting pipes 0202 may be respectively fastened in two grooves 0204, the heat sink fin 0203 is disposed on an upper plate surface of the base plate 0201, and the heat conducting pipes 0202 are sealed in the grooves 0204. The heat sink fins 0203 and the base plate 0201 may be fastened and connected in a tin welding manner. To ensure a welding effect, the upper plate surface of the base plate 0201 may be plated with a layer of nickel material by using a chemical plating process. Correspondingly, a lower surface of the heat sink fins 0203 may be plated with a layer of nickel material by using the chemical plating process, to improve a welding effect between the base plate 0201 and the heat sink fin 0203. It may be understood that, in another implementation, the base plate 0201 and the heat sink fins 0203 may alternatively be fastened and connected in a manner such as laser welding. A connection manner between the base plate 0201 and the heat sink fin 0203 is not limited in this disclosure.

Heat dissipation efficiency of the heat sink 02 may be effectively improved by using the heat conducting pipes 0202. Specifically, the heat conducting pipes 0202 may perform a transverse conduction function on heat in the base plate 0201. For example, when a temperature of a left side of the base plate 0201 is high, heat is transferred to the right by using the heat conducting pipes 0202, which is conducive to increasing a distribution area of the heat in the heat sink 02.

The heat sink fins 0203 may effectively increase a heat exchange area between the heat sink 02 and the outside, so that heat dissipation efficiency of the heat sink 02 is improved. Specifically, the heat sink fins 0203 include a plurality of heat sink teeth that are disposed vertically at intervals. The heat sink teeth may effectively increase a heat exchange area between the heat sink 02 and the outside, to improve heat dissipation efficiency of the heat sink 02. During preparation, the heat sink fins 0203 may be manufactured by using a material such as aluminum or aluminum alloy and by using a process such as die casting forming or machine tool processing. Alternatively, the plurality of heat sink teeth in the heat sink fins 0203 may be separately manufactured and formed, and then assembled into an integrated structure by using a process such as welding.

In actual application, the foregoing heat conducting layer 20 may be disposed on the lower plate surface of the base plate 0201. The base plate 0201 may also be understood as the foregoing substrate 10, or the substrate 10 is a part of the base plate 0201. To be specific, a lower surface of the base plate 0201 includes a heat conducting surface 11. The heat conducting layer 20 surface may form a surface with high heat conduction efficiency and high hardness on the lower surface of the base plate 0201. When the base plate 0201 is in dry contact with another part through the heat conducting layer 20, thermal resistance may be effectively reduced.

Figure 14:
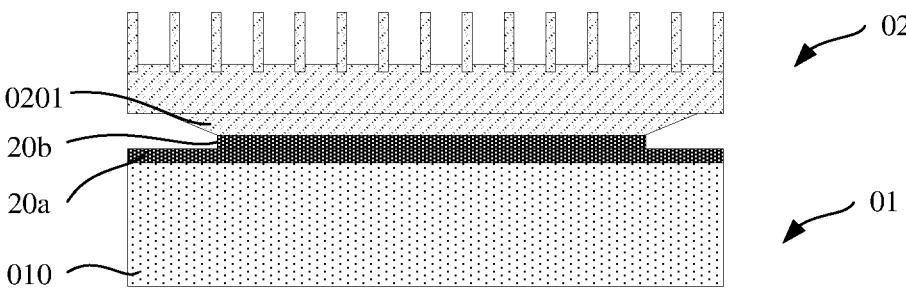
FIG. 14 is a schematic diagram of a structure of dry contact between an optical module and a heat sink according to an embodiment of this disclosure.

FIG. 14 is a schematic diagram of a structure after an optical module 01 is in dry contact with a heat sink 02. In the figure, a heat conducting layer 20a is disposed on an upper surface of a housing 010 of the optical module 01, and a heat conducting layer 20b is also disposed on a lower surface of a base plate 0201 of the heat sink 02. Specific structures of the heat conducting layer 20a and the heat conducting layer 20b may be the same or may be different. In addition, in another implementation, the heat conducting layer 20a may be disposed on the upper surface of the housing 010 of the optical module 01, and the heat conducting layer 20b may not be disposed on the lower surface of the base plate 0201 of the heat sink 02. Alternatively, the heat conducting layer 20a may not be disposed on the upper surface of the housing 010 of the optical module 01, and the heat conducting layer 20b may be disposed on the lower surface of the base plate 0201 of the heat sink 02.

Figure 15:
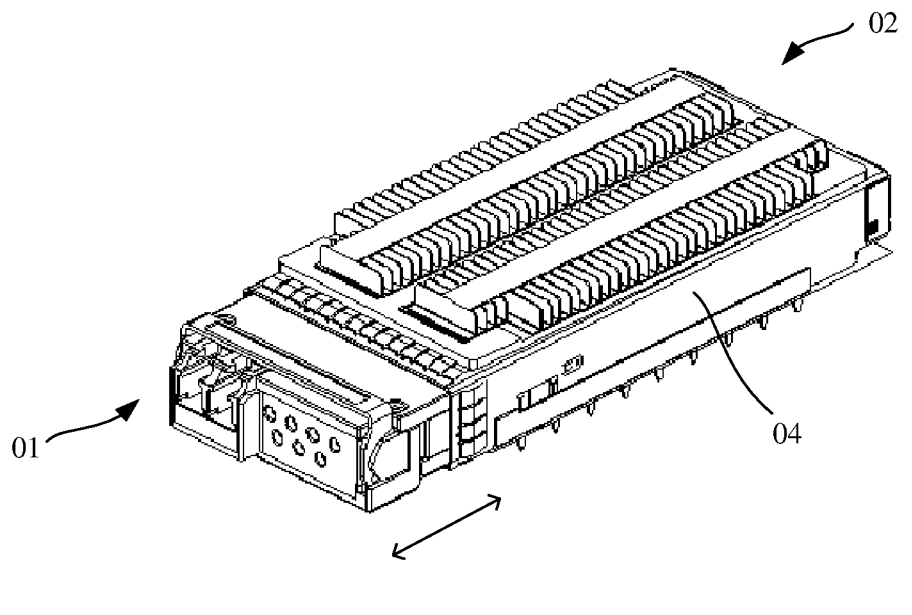
FIG. 15 is a schematic diagram of a specific application structure of an optical module and a heat sink according to an embodiment of this disclosure.

In addition, as shown in FIG. 15, in actual application, when the optical module 01 is applied to an optical network device, the optical module 01 is usually installed in an optical cage 04 in the optical network device in a pluggable manner. The optical cage 04 not only can provide required installation space for the optical module 01, but also can provide an electromagnetic shielding property for the optical module 01, to prevent the optical module 01 from being affected by electromagnetic interference or another undesirable effect. The optical network device may be a plurality of different types of devices such as an optical fiber transceiver, a switch, an optical fiber router, an optical fiber network adapter, or a base station. An application scenario of the optical module is not specifically limited in this disclosure.

In specific application, the heat sink 02 may be fastened to an upper end of the optical cage 04. After the optical module 01 is inserted into the optical cage 04, effective dry contact may be formed between the optical module 01 and the heat sink 02.

The following table is a test result of a heat dissipation effect of the optical module 01 after the heat conducting layer 20*a* is disposed on the upper surface of the housing 010 of the optical module 01 and the heat conducting layer 20*b* is disposed on the lower surface of the base plate 0201 of the heat sink 02.

| Heat dissipation test result of the optical module | | | | |
| --- | --- | --- | --- | --- |
| Key components in the optical module | Chip | Optical component 1 | Optical component 2 | Optical component 3 |
| Temperature decreasing value (° C.) | 8° C.+ | 4° C.+ | 5° C.+ | 5° C.+ |

In the foregoing test result, working power of the used optical module is 26 W, and specification is CFP2. In addition, the result is measured under pressure of 2 kg/cm² of the heat sink. To be specific, a value of pressure between the heat conducting layer 20*a* and the heat conducting layer 20*b* is about 2 kg/cm²=0.196 MPa. The chip in the table may be a drive chip in the optical module. The optical component 1, the optical component 2, and the optical component 3 are components that are in the optical module and that are configured to implement different optical signal processing or conversion, and may be any one of an optical transmitting component, an optical receiving component, or a photoelectric conversion component.

It can be learned from the foregoing table that, after the optical module 01 is in dry contact with the heat sink 02 by using the heat conducting layer 20*a* and the heat conducting layer 20*b*, heat dissipation efficiency of the optical module 01 may be obviously improved, which is conducive to heat dissipation of the optical module 01.

It may be understood that, in specific application, in addition to being applied to the optical module 01 or the heat sink 02, the foregoing heat conducting member may be further applied to a plurality of components that need to implement heat conduction through dry contact. A specific application scope of the heat conducting member is not limited in this disclosure.

The foregoing descriptions are merely specific implementations of this disclosure, but are not intended to limit a protection scope of this disclosure. Any variation or replacement readily figured out by a person skilled in the art within the technical scope disclosed in this disclosure should fall within the protection scope of this disclosure. Therefore, the protection scope of this disclosure shall be subject to the protection scope of the claims.

What is claimed is:

1. An optical network device comprising an optical module, a heat conducting layer and a heat sink, wherein the heat conducting layer is disposed on an upper surface of a housing of the optical module and is in direct contact with a lower surface of a base plate of the heat sink, wherein:

the heat conducting layer comprises a transition layer and a protective layer;

the transition layer is disposed on the upper surface of the housing;

the protective layer is disposed on a surface of the transition layer that is away from the heat conducting layer;

a surface roughness of the protective layer is less than or equal to 0.4 μm Ra;

a material of the transition layer is any one of nickel, chromium, or chromium nitride; and a material of the protective layer is any one of diamond, diamond-like carbon, or amorphous alloy.

2. The optical network device according to claim 1, wherein a microhardness (HV) of the protective layer is greater than 1000.

3. The optical network device according to claim 1, wherein the heat conducting layer further comprises an auxiliary bonding layer; and the auxiliary bonding layer is located between the transition layer and the protective layer, and is configured to improve bonding strength between the transition layer and the protective layer.

4. The optical network device according to claim 3, wherein a material of the auxiliary bonding layer is tungsten carbide or chromium carbide.

5. The optical network device according to claim 1, wherein the heat conducting layer further comprises an abrasive layer, the abrasive layer is located between the heat conducting layer and the transition layer, and the abrasive layer is a polishable layer.

6. The optical network device according to claim 5, wherein a material of the abrasive layer is copper or a copper alloy.

7. The optical network device according to claim 5, wherein a surface roughness of a surface of the abrasive layer and that is away from the heat conducting layer is less than or equal to 0.4 μm Ra.

8. The optical network device according to claim 5, wherein the heat conducting layer further comprises an auxiliary bonding layer; and the auxiliary bonding layer is located between the heat conducting layer and the abrasive layer, and is configured to improve bonding strength between the heat conducting layer and the abrasive layer.

9. The optical network device according to claim 8, wherein a material of the auxiliary bonding layer is nickel or chromium.

10. The optical network device according to claim 1, wherein:

a surface roughness of the transition layer is a same as a surface roughness of the heat conducting layer; and the die surface roughness of the protective layer is a same as the surface roughness of the transition layer.

* * * * *